United States Patent
Kurosaka et al.

(10) Patent No.: US 8,124,174 B2
(45) Date of Patent: *Feb. 28, 2012

(54) ELECTROLESS GOLD PLATING METHOD AND ELECTRONIC PARTS

(75) Inventors: Seigo Kurosaka, Hirakata (JP); Yukinori Oda, Hirakata (JP); Akira Okada, Hirakata (JP); Ayumi Okubo, Hirakata (JP); Masayuki Kiso, Hirakata (JP)

(73) Assignee: C. Uyemura & Co., Ltd., Osaka-Shi, Osaka (JP)

( * ) Notice: Subject to any disclaimer, the term of this patent is extended or adjusted under 35 U.S.C. 154(b) by 876 days.

This patent is subject to a terminal disclaimer.

(21) Appl. No.: 12/102,536

(22) Filed: Apr. 14, 2008

(65) Prior Publication Data

US 2008/0277140 A1  Nov. 13, 2008

(30) Foreign Application Priority Data

Apr. 16, 2007 (JP) ................... 2007-107198

(51) Int. Cl.
- *C23C 18/16* (2006.01)
- *C23C 18/34* (2006.01)
- *C23C 18/44* (2006.01)
- *B05D 1/36* (2006.01)

(52) U.S. Cl. .......... 427/97.1; 427/99.5; 427/99.1; 427/123; 427/125; 427/443.1; 438/678

(58) Field of Classification Search .......... 427/97.1
See application file for complete search history.

(56) References Cited

U.S. PATENT DOCUMENTS

| | | | | |
|---|---|---|---|---|
| 4,666,610 A | * | 5/1987 | Kuhns | 210/749 |
| 5,380,562 A | * | 1/1995 | Hattori et al. | 427/437 |
| 5,919,377 A | * | 7/1999 | Chisholm et al. | 210/800 |
| 2008/0138506 A1 | * | 6/2008 | Kiso et al. | 427/99.5 |
| 2008/0138507 A1 | * | 6/2008 | Kiso et al. | 427/99.5 |

FOREIGN PATENT DOCUMENTS

| | | | |
|---|---|---|---|
| CN | 1802452 A | | 7/2006 |
| JP | 8-269726 A2 | | 10/1996 |
| JP | 9-008438 A | | 1/1997 |
| JP | 10-147884 A | | 6/1998 |
| JP | 10-242205 A | | 9/1998 |
| JP | 2000-208555 A | | 7/2000 |
| JP | 2002-118134 A | | 4/2002 |
| JP | 3345529 B2 | | 8/2002 |
| JP | 2003-277942 | * | 10/2003 |
| JP | 2004-137589 | * | 5/2004 |
| JP | 3565302 B2 | | 6/2004 |
| JP | 3596335 B2 | | 9/2004 |
| JP | 2004-332025 A | | 11/2004 |
| JP | 2006-339609 A | | 12/2006 |
| WO | WO 2006/112215 A1 | | 10/2006 |
| WO | WO 2004/038063 A1 | | 4/2011 |

OTHER PUBLICATIONS

Machine translation of Japan 2002-118134, first published in Japanese, Apr. 2002.*
Machine English translation of WO-2004/038063 (published in Japanese May 2004) from the Japan AIPN translation system, 18 pages.*

* cited by examiner

*Primary Examiner* — Katherine A Bareford
(74) *Attorney, Agent, or Firm* — Birch, Stewart, Kolasch & Birch, LLP

(57) ABSTRACT

Part or whole of an electroless gold plating film of a plated film laminate including an electroless nickel plating film, an electroless palladium plating film and an electroless gold plating film is formed by an electroless gold plating using an electroless gold plating bath including a water-soluble gold compound, a complexing agent, formaldehyde and/or a formaldehyde-bisulfite adduct, and an amine compound represented by the following general formula $R_1$—NH—$C_2H_4$—NH—$R_2$ or $R_3$—$(CH_2$—NH—$C_2H_4$—NH—$CH_2)_n$—$R_4$. The method of the invention does not need two types of baths, a flash gold plating bath and a thick gold plating bath for thickening. Gold plating films of different thicknesses suited for solder bonding or wire bonding can be formed using only one type of gold plating bath.

6 Claims, No Drawings

ELECTROLESS GOLD PLATING METHOD AND ELECTRONIC PARTS

BACKGROUND OF THE INVENTION

This invention relates to an electroless gold method and also to electronic parts that are electrolessly gold plated by the method.

Hitherto, electroless nickel/immersion gold platings have been in frequent use for surface treatment for applications that require high reliability in mounting processes of printed circuit boards or electronic parts. In the immersion gold plating, gold is deposited by using a difference in redox potential between an underlying nickel layer and a plating bath, so that gold dissolves the nickel thereby corroding the nickel. In addition, diffusion of nickel over the gold film takes place, thereby lowering wire bondability. To avoid this, reduction gold plating is further performed on the electroless nickel/immersion gold plating films to make a thick gold film thereby suppressing the wire bondability from lowering, but with a problem of costs.

On the other hand, according to the recent lead-free promotion, there is a trend toward the use of Sn—Ag—Cu solder. However, a greater thermal load is needed upon solder bonding when compared with conventional tin-lead eutectic solders, with the attendant problem that bonding characteristics lower. To cope with this, there has been recently carried out a method of avoiding the above problem wherein a palladium film is sandwiched between the electroless nickel plating layer and the immersion gold plating layer according to electroless palladium plating.

It will be noted that mention is made, as related art technical literatures, of Japanese Patent Laid-open No. Hei 10-242205, Japanese Patent No. 3565302, Japanese Patent No. 3596335, Japanese Patent No. 3345529, Japanese Patent Laid-open No. 2004-332025, Japanese Patent Laid-open No. 2002-118134, Japanese Patent Laid-open No. 2006-339609 and Japanese Patent Laid-open No. Hei 8-269726.

SUMMARY OF THE INVENTION

With a surface treatment for the purpose of solder bonding, a gold film on a palladium film may be thinly plated at about 0.05 µm (by flash gold plating). When the gold plating film is too thick, alloy formation of tin and nickel does not become uniform, with concern that solder bondability lowers. With a surface treatment for the purpose of solder bonding, it is usual from the standpoint of costs that a thickness capable of imparting the rust-proof function of an underlying metal is at about 0.05 µm.

With a surface treatment for the purpose of wire bonding, a gold film on a palladium film should have a thickness of 0.2 µm or over. Until now, after thin coating by immersion gold plating (flash gold plating), thick coating by reduction gold plating is carried out. Wire bondability is more advantageous when the gold film is thicker. This is because a thicker gold film is more capable of suppressing underlying nickel from being diffused and, at the same time, results in higher bonding strength.

Where solder bonding and wire bonding are both carried out with respect to the same substrate, e.g. where a substrate is subjected to different treatments in a next step on opposite surfaces thereof (e.g. wire bonding on a front surface and solder bonding on a back surface), the thickness of the gold film on the palladium film is set at about 0.2 to 0.3 µm. A thick gold film is better for wire bonding and a thin gold film is better for solder bondability. Although an optimum thickness changes depending on the requirement for a higher characteristic as to whichever of wire bonding or solder bonding, it is considered that about 0.2 to 0.3 µm is optimal as a thickness at which both bondings are mutually balanced.

Conventionally, when a gold plating film is formed on a palladium film in a certain thickness (especially, in 0.15 µm or over), gold is once thin-plated by immersion gold plating (flash gold plating) on the palladium film because direct thick coating or plating on the palladium film by reduction gold plating is not possible. Thereafter, it is needed to increase the thickness by reduction gold plating. It is almost difficult to form a gold plating film with a thickness of not smaller than 0.15 µm by immersion gold plating. On the other hand, when the gold plating film is thickened by direct reduction gold plating, the thickness of the gold film varies. Accordingly, characteristics necessary for the wire bonding or solder bonding are not obtained.

Under these circumstances in the art, the invention has for its object the provision of a method wherein an electroless gold plating film of a plated film laminate formed of an electroless nickel plating film, an electroless palladium plating film and an electroless gold plating film can be efficiently formed.

We made intensive studies so as to solve the above problems and, as a result, found that where a plated film laminate is formed of an electroless nickel plating film, an electroless palladium plating film and an electroless gold plating film, the electroless gold plating film is formed by electroless gold plating using a gold plating bath including a water-soluble gold compound, a complexing agent, formaldehyde and/or a formaldehyde bisulfite adduct, and an amine compound represented by the following general formula (1) or (2)

  (1)

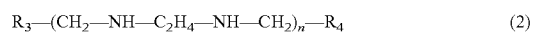  (2)

(in the formulae (1) and (2), $R_1$, $R_2$, $R_3$ and $R_4$ represent —OH, —CH$_3$, —CH$_2$OH, —C$_2$H$_4$OH, —CH$_2$N(CH$_3$)$_2$, —CH$_2$NH(CH$_2$OH), —CH$_2$NH(C$_2$H$_4$OH), —C$_2$H$_4$NH (CH$_2$OH), —C$_2$H$_4$NH(C$_2$H$_4$OH), —CH$_2$N(CH$_2$OH)$_2$, —CH$_2$N(C$_2$H$_4$OH)$_2$, —C$_2$H$_4$N(CH$_2$OH)$_2$ or —C$_2$H$_4$N (C$_2$H$_4$OH)$_2$ and may be the same or different and n is an integer of 1 to 4). In doing so, the electroless gold plating film can be efficiently formed by use of one kind of plating bath for different thicknesses adapted for solder bonding or wire bonding. Especially, an electroless gold plating film, which is suited for solder bonding and wire bonding or suited for wire bonding and has a thickness of not smaller than 0.15 µm, can be efficiently, effectively formed by one step using one kind of plating bath, thus arriving at completion of the invention.

More particularly, the invention provides, as a first invention,

[1] a method for forming a plated film laminate obtained by forming, on a surface to be plated of an electronic part such as a printed circuit board, a ceramic substrate or a semiconductor substrate, a 0.1 to 20 µm thick of electroless nickel plating film through a catalyst, further forming a 0.001 to 0.3 µm thick of electroless palladium plating film on the electroless nickel plating film, and still further forming an electroless 0.01 to 1.0 µm thick of electroless gold plating film on the electroless palladium plating film, characterized in that part or whole of the electroless gold plating film of the plated film laminate is formed by a first electroless gold plating using a first electroless gold plating bath including a water-soluble gold compound, a complexing agent, formaldehyde and/or a formaldehyde bisulfite adduct, and an amine compound represented by the following general formula (1) or (2)

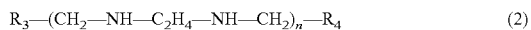

(in the formulae (1) and (2), $R_1$, $R_2$, $R_3$ and $R_4$ represent —OH, —$CH_3$, —$CH_2OH$, —$C_2H_4OH$, —$CH_2N(CH_3)_2$, —$CH_2NH(CH_2OH)$, —$CH_2NH(C_2H_4OH)$, —$C_2H_4NH(CH_2OH)$, —$C_2H_4NH(C_2H_4OH)$, —$CH_2N(CH_2OH)_2$, —$CH_2N(C_2H_4OH)_2$, —$C_2H_4N(CH_2OH)_2$ or —$C_2H_4N(C_2H_4OH)_2$ and may be the same or different and n is an integer of 1 to 4).

[2] In this method, it is preferred that the electroless gold plating film is wholly formed in a thickness of not smaller than 0.15 μm only by the first electroless gold plating.

[3] It is also preferred that part of the electroless gold plating film is formed by the electroless gold plating using the first electroless gold plating bath and the balance of the electroless gold plating film is formed by a second electroless gold plating using a second reduction gold plating bath different from the first electroless gold plating bath.

Especially, the methods of [1] to [3] are suited for the case where the surface of the electroless gold plating film is provided as a face to be solder bonded. The methods of [2] and [3] are suited for the case where the surface of the electroless gold plating film is provided as a face to be wire bonded.

Further, the invention provides, as a second invention, an electronic part such as a printed circuit board, a ceramic substrate or a semiconductor substrate which has, on a surface thereof to be plated, a plated film laminate obtained by forming a 0.1 to 20 μm of thick electroless nickel plating film through a catalyst, further forming a 0.001 to 0.3 μm thick of electroless palladium plating film on the electroless nickel plating film, and still further forming an electroless 0.01 to 1.0 μm thick of electroless gold plating film on the electroless palladium plating film, characterized in that part or whole of the electroless gold plating film is formed by a first electroless gold plating using a first electroless gold plating bath including a water-soluble gold compound, a complexing agent, formaldehyde and/or a formaldehyde bisulfite adduct, and an amine compound represented by the following general formula (1) or (2)

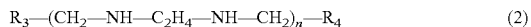

(in the formula (1) or (2), $R_1$, $R_2$, $R_3$ and $R_4$ represent —OH, —$CH_3$, —$CH_2OH$, —$C_2H_4OH$, —$CH_2N(CH_3)_2$, —$CH_2NH(CH_2OH)$, —$CH_2NH(C_2H_4OH)$, —$C_2H_4NH(CH_2OH)$, —$C_2H_4NH(C_2H_4OH)$, —$CH_2N(CH_2OH)_2$, —$CH_2N(C_2H_4OH)_2$, —$C_2H_4N(CH_2OH)_2$ or —$C_2H_4N(C_2H_4OH)_2$ and may be the same or different and n is an integer of 1 to 4).

The method of the invention does not need to provide two types of baths, a flash gold plating bath and a thick gold plating bath for thickening, but one type of gold plating bath enables gold plating films of different thicknesses suited for solder bonding or wire bonding to be formed. Especially, because an electroless gold plating film with a thickness of not smaller than 0.15 μm can be formed using one kind of plating bath by one step in an efficient, effective manner, simplification of the procedure is possible with the attendant advantage in costs.

DETAILED DESCRIPTION OF THE PREFERRED EMBODIMENTS

The electroless gold plating method of the invention is directed to the formation of an electroless gold plating film of a plated film laminate, which is obtained by forming, on a surface of an electronic part to be plated, a 0.1 to 20 μm thick of electroless nickel plating film through a catalyst, further forming a 0.001 to 0.3 μm thick of electroless palladium plating film on the electroless nickel plating film, and still further forming a 0.01 to 1.0 μm thick of electroless gold plating film.

In the practice of the invention, the formation of the catalytic electroless nickel plating film and the electroless palladium plating film of the plated film laminate can be carried out by application of conventional, known techniques, and the electroless gold plating method of the invention is applicable as so-called ENEPIG (Electroless Nickel Electroless Palladium Immersion Gold), i.e. as a method for forming a gold plating film on an underlying electroless nickel plating film (formed on copper) through an electroless palladium plating film.

When the electroless nickel plating film is formed on a surface to be plated (e.g. a surface of a copper substrate) through a catalyst, a metal serving as the catalyst includes nickel, cobalt, iron, silver, gold, ruthenium, palladium, platinum or the like, of which palladium is preferred. The deposition amount of the catalyst may be one sufficient for activation to an extent that an electroless nickel film is deposited on the surface to be plated. When an amount of deposition is at not smaller than $0.1 \times 10^{-4}$ mg/dm$^2$, preferably not smaller than $1 \times 10^{-4}$ mg/dm$^2$, the resulting film may not be continuous.

Although the electroless nickel plating film formed has no limitation with respect to the type of plating bath, the electroless nickel plating film is preferably one that is formed by a plating bath described in Japanese Patent laid-open No. Hei 8-269726. This electroless nickel plating bath is characterized by adding a compound having an S—S bond to a plating bath containing a water-soluble nickel salt, a reducing agent and a complexing agent.

The water-soluble salt used includes nickel sulfate, nickel chloride or the like and is preferably used in an amount of 0.01 to 1 mol/liter, more preferably 0.05 to 0.2 mols/liter. The reducing agent includes a hypophosphorous acid such as hypophosphite, sodium hypophosphite or the like, dimethylamine borane, trimethylamine borane, hydrazine or the like. The amount of the reducing agent is preferably in the range of from 0.01 to 1 mol/liter, more preferably from 0.05 to 0.5 mols/liter.

The complexing agent includes a carboxylic acid such as malic acid, succinic acid, lactic acid, citric acid or the like and a sodium salt thereof, or an amino acid such as glycine, alanine, iminodiacetic acid, arginine or glutamic acid. The amount is preferably in the range of from 0.01 to 2 mols/liter, more preferably from 0.05 to 1 mol/liter.

Although the S—S sulfur bond-containing compounds may be organic sulfur compounds, inorganic sulfur compounds such as thiosulfates, dithionates, polythionates (e.g. $O_3S$—$S_n$—$SO_3$ wherein n=1 to 4) and dithionites are preferably mentioned. It will be noted that salts used are water-soluble salts such as sodium salts and the like. The amount of the sulfur bond-containing compound is preferably in the range of from 0.01 to 100 mg/liter, more preferably from 0.05 to 50 mg/liter. When the amount is smaller than 0.01 mg/liter, the above-stated object of the invention cannot be achieved satisfactorily. Over 100 mg/liter, there occurs a phenomenon wherein no plating film is deposited at all.

The electroless nickel plating solution may be further admixed with a water-soluble lead salt such as lead acetate or a sulfur compound such as thioglycolic acid generally used as a stabilizing agent. The amount is preferably in the range from 0.1 to 100 mg/liter. The pH of the electroless nickel plating solution ranges from 4 to 7, preferably from 4 to 6.

When a nickel film is formed by use of the above plating bath, the deposition rate of nickel is improved, deposition at the outside of a pattern is suppressed, and the deposition rate of palladium is prevented from lowering. Where the electroless nickel plating film is made of a Ni—P alloy film, the content of P in the film is preferably from 3 to 10 wt %. Outside the above range, there is concern that solder bondability and wire bondability lower.

The electroless nickel plating film formed should preferably have a thickness of from 0.1 to 20 μm, more preferably from 1 to 15 μm. When the thickness is smaller than 0.1 μm, there is concern that wire bondability lowers. Over 20 μm, it takes a long plating time, with the possibility that productivity becomes worsened, thus being disadvantageous in cost.

On the other hand, the electroless palladium plating film formed has no limitation with respect to the type of plating bath such as a immersion type, a reduction type (a formic acid bath, a hypophosphite bath, or a phosphite bath) or the like. It is preferred to form a plating film in an electroless palladium plating bath, which is characterized by including, for example, a palladium compound, at least one compound selected from ammonia and amine compounds for use as a complexing agent, at least one hypophosphorous acid compound selected from hypophosphorous acid and hypophosphites for use as a reducing agent, and at least one unsaturated carboxylic acid compound selected from unsaturated carboxylic acids, unsaturated carboxylic anhydrides, unsaturated carboxylic acid salts and unsaturated carboxylic acid derivatives.

The palladium compound may be any of those compounds that are soluble in water and include, for example, palladium chloride, palladium sulfate, palladium acetate, palladium nitrate, tetraamine palladium chloride and the like. The amount is preferably in the range from 0.001 to 0.5 mols/liter, more preferably from 0.005 to 0.1 mol/liter calculated as palladium. Smaller amounts result in the lowering of a plating rate and larger amounts may lower physical properties of the film.

At least one member selected from hypophosphorous acid and hypophosphites is contained as a reducing agent. The amount is preferably in the range from 0.001 to 5 mols/liter, more preferably from 0.2 to 2 mols/liter. Smaller amounts lower the deposition rate and larger amounts may instabilize the bath. As a hypophosphate, mention is made of sodium hypophosphite, ammonium hypophosphite and the like.

At least one member selected from ammonia and amine compounds is further contained as a complexing agent. The amount is preferably in the range of from 0.001 to 10 mols/liter, more preferably from 0.1 to 2 mols/liter. Smaller amounts lower the bath stability and larger amounts lower the plating rate. The amine compounds include methylamine, dimethylamine, trimethylamine, benzylamine, methylenediamine, ethylenediamine, tetramethylenediamine, diethylenetriamine, EDTA, sodium EDTA, potassium EDTA, glycine and the like. These may be used singly or in combination of two or more.

The electroless palladium plating bath includes, aside from those components set out above, at least one unsaturated carboxylic acid compound selected from unsaturated carboxylic acids, unsaturated carboxylic anhydrides, unsaturated carboxylic acid salts, and unsaturated carboxylic acid derivatives. Specific examples of the unsaturated carboxylic acid include acrylic acid, propiolic acid, crotonic acid, isocrotonic acid, methacrylic acid, maleic acid, fumaric acid, citraconic acid, trans-2-butene-1,2-dicarboxylic acid, itaconic acid, tetrolic acid, aconitic acid, muconic acid, sorbic acid, tiglic acid, angelic acid, senecioic acid, glutaconic acid, mesaconic acid, oleic acid, linoleic acid, cinnamic acid and the like. The unsaturated carboxylic acid anhydrides and unsaturated carboxylic acid salts include anhydrides, sodium salts, ammonium salts and the like of those unsaturated carboxylic acids indicated above. Moreover, mention is made, as an unsaturated carboxylic acid derivative, of ethyl methacrylate, phenyl methacrylate, isobutyl acrylate, methyl propiolate, maleic hydrazide and the like. These unsaturated carboxylic acids, unsaturated carboxylic anhydrides, unsaturated carboxylic acid salts and unsaturated carboxylic acid derivatives may be used singly or in combination of two or more.

Especially, preferable unsaturated carboxylic acids, unsaturated carboxylic anhydrides, unsaturated carboxylic acid salts and unsaturated carboxylic acid derivatives include acrylic acid, methacrylic acid, maleic acid, fumaric acid, itaconic acid, citraconic acid and mesaconic acid, and anhydrides, salts and derivatives thereof. When using these unsaturated carboxylic acid compounds, the bath is excellent in stability and there can be obtained a palladium film that is excellent in solder bondability and wire bondability.

The amount of an unsaturated carboxylic acid compound ranges preferably from 0.001 to 10 mols/liter, more preferably from 0.01 to 0.5 mols/liter. When the amount is smaller, an effect on the bath stability cannot be fully achieved. In contract, when the amount is larger, there is a tendency toward the lowering of plating rate.

The electroless palladium plating bath has preferably a pH of from 4 to 10, more preferably from 6 to 8. A lower pH decreases the stability of plating bath and a higher pH increases a plating rate, with the tendency toward the deterioration of solder bonding and wire bonding characteristics.

The thickness of the electroless palladium plating film is preferably in the range from 0.001 to 1.0 μm, more preferably from 0.01 to 0.3 μm. When the thickness is smaller than 0.001 μm, there is concern that wire bondability lowers. Over 1.0 μm, solder bondability may lower with a disadvantage in cost.

In the practice of the invention, part or whole of the electroless gold plating film is formed according to the first electroless gold plating using an electroless gold plating bath comprising a water-soluble gold compound, a complexing agent, formaldehyde and/or a formaldehyde bisulfite adduct and an amine compound represented by the following general formula (1) or (2)

$$R_1\text{—NH—}C_2H_4\text{—NH—}R_2 \quad (1)$$

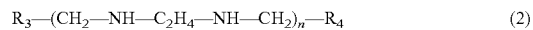

$$R_3\text{—}(CH_2\text{—NH—}C_2H_4\text{—NH—}CH_2)_n\text{—}R_4 \quad (2)$$

(in the formula (1) or (2), $R_1$, $R_2$, $R_3$ and $R_4$ represent —OH, —CH$_3$, —CH$_2$OH, —C$_2$H$_4$OH, —CH$_2$N(CH$_3$)$_2$, —CH$_2$NH(CH$_2$OH), —CH$_2$NH(C$_2$H$_4$OH), —C$_2$H$_4$NH(CH$_2$OH), —C$_2$H$_4$NH(C$_2$H$_4$OH), —CH$_2$N(CH$_2$OH)$_2$, —CH$_2$N(C$_2$H$_4$OH)$_2$, —C$_2$H$_4$N(CH$_2$OH)$_2$ or —C$_2$H$_4$N(C$_2$H$_4$OH)$_2$ and may be the same or different and n is an integer of 1 to 4).

Unlike a conventional immersion gold plating bath, the electroless gold plating bath of the invention is an electroless gold plating bath of the substitution-reduction type wherein both substitution reaction and reduction reaction proceed in the same plating bath. Since formaldehyde and/or a formaldehyde bisulfite adduct and the amine compound represented by the general formula (1) or (2) and having a specific type of structure are contained in the gold plating bath, the electroless gold plating bath of the invention allows not only gold to be deposited on an underlying metal by the substitution reaction, but also gold to be further deposited by means of a reducing agent through the initially deposited gold as a catalyst.

When palladium is used as an underlying layer, a difference in potential between the palladium and gold is small. In this condition, when gold plating is carried out on palladium by use of a conventional immersion gold plating bath, a uniform film thickness cannot be obtained and a satisfactory film thickness is not ensured. In contrast, the electroless gold plating bath of the invention allows a palladium surface to be activated and gold to be deposited by means of a reducing agent while using the palladium as a catalyst. Gold can be further deposited using the once deposited gold as a catalyst, so that the gold plating film can be thickened on the palladium. Accordingly, in the practice of the invention, the whole of the electroless-gold plating film can be made as thick as 0.15 μm or over (not larger than 1.0 μm), particularly, not smaller than 0.2 μm that is suited for the case where the surface of the electroless gold plating film is provided as a wire bonding face, according only to the first electroless gold plating alone. Especially, the invention is suited for the formation of a 0.2 to 0.3 μm thick of film which is favorable for use as both a solder bonding face and a wire bonding face.

The water-soluble gold compounds contained in the electroless gold plating bath of the invention include gold cyanide salts such as gold cyanide, gold potassium cyanide, gold sodium cyanide, gold ammonium cyanide and the like, and sulfites, thiosulfates, thiocyanates, sulfates, nitrates, methanesulfonates, tetraammine complexes, chlorides, bromides, iodides, hydroxides, oxides and the like of gold. Of these, gold cyanide salts are preferred.

The content of the water-soluble gold compound is preferably in the range from 0.0001 to 1 mol/liter, more preferably from 0.002 to 0.03 mols/liter, calculated as gold. When the content is less than the above range, there is concern that the deposition rate lowers. Over the above range, an economical disadvantage may result in some case.

The complexing agent contained in the electroless gold plating bath of the invention may be known ones ordinarily employed in electroless plating baths. Mention is made, for example, of phosphoric acid, boric acid, citric acid, gluconic acid, tartaric acid, lactic acid, malic acid, ethylenediamine, triethanolamine, ethylenediamine tetraacetic acid, nitrilotriacetic acid, diethylenetriamine pentaacetic acid, hydroxyethylethylenediamine triacetic acid, triethylenetetramine hexaacetic acid, 1,3-propanediamine tetraacetic acid, 1,3-diamino-2-hydroxypropane tetraacetic acid, hydroxyethylimino diacetic acid, dihydroxyl glycine, glycol ether diamine tetraacetic acid, dicarboxymethyl glutamic acid, hydroxyethylidene diphosphoric acid, ethylenediamine tetra (methylenephosphoric acid), alkali metal (e.g. sodium or potassium) salts, alkaline earth metal salts and ammonium salts thereof.

The concentration of the complexing agent preferably ranges from 0.001 to 1 mol/liter, more preferably from 0.01 to 0.5 mols/liter. When the concentration is smaller than the above range, there is concern that the deposition rate lowers due to the metal dissolved out. Over the above range, an economical disadvantage may result in some case.

The electroless gold plating bath of the invention contains formaldehyde and/or a formaldehyde bisulfite adduct therein. Specific examples of the formaldehyde bisulfite adduct include sodium formaldehyde bisulfite, potassium formaldehyde bisulfite, ammonium formaldehyde bisulfite and the like.

The concentration of the formaldehyde and/or formaldehyde bisulfate adduct is preferably in the range of 0.0001 to 0.5 mols/liter, more preferably from 0.001 to 0.3 mols/liter. When the concentration is smaller than the above range, there is concern that the underlying nickel is corroded. Over the above range, there is concern for the instability of the bath.

The electroless gold plating bath of the invention contains an amine compound represented by the following general formula (1) or (2)

$$R_1\text{---}NH\text{---}C_2H_4\text{---}NH\text{---}R_2 \quad (1)$$

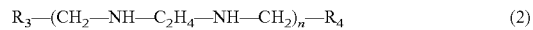

$$R_3\text{---}(CH_2\text{---}NH\text{---}C_2H_4\text{---}NH\text{---}CH_2)_n\text{---}R_4 \quad (2)$$

(in the formulae (1) and (2), $R_1$, $R_2$, $R_3$ and $R_4$ represent —OH, —CH$_3$, —CH$_2$OH, —C$_2$H$_4$OH, —CH$_2$N(CH$_3$)$_2$, —CH$_2$NH(CH$_2$OH), —CH$_2$NH(C$_2$H$_4$OH), —C$_2$H$_4$NH (CH$_2$OH), —C$_2$H$_4$NH(C$_2$H$_4$OH), —CH$_2$N(CH$_2$OH)$_2$, —CH$_2$N(C$_2$H$_4$OH)$_2$, —C$_2$H$_4$N(CH$_2$OH)$_2$ or —C$_2$H$_4$N (C$_2$H$_4$OH)$_2$ and may be the same or different and n is an integer of 1 to 4).

The formaldehyde and/or formaldehyde bisulfite adduct does not act as a reducing agent when used alone, but develops the reduction action in coexistence with the amine compound.

The concentration of these amine compounds is preferably in the range of from 0.001 to 3 mols/liter, more preferably from 0.01 to 1 mol/liter. When the concentration is smaller than the above range, there is concern that the deposition rate lowers. Over the above range, there is concern that the bath becomes instabilized.

It will be noted that the molar ratio between the formaldehyde and/or formaldehyde bisulfite adduct and the amine compound is preferably such that formaldehyde and/or formaldehyde bisulfite adduct:amine compound=1:30 to 3:1, more preferably 1:10 to 1:1. When the ratio of the formaldehyde and/or formaldehyde bisulfite adduct is larger than the above range, there is concern that the bath becomes instabilized. When the ratio of the amine compound is larger than the above range, an economical disadvantage may result.

The pH of the electroless gold plating bath of the invention is preferably in the range from 5 to 10. When the pH is less than the above range, there is concern that the deposition rate lowers. Over the range, the bath may become instabilized. The pH adjuster used includes sodium hydroxide, potassium hydroxide, ammonia, sulfuric acid, phosphoric acid, boric acid and the like, as employed in known plating baths.

The temperature of the electroless gold plating bath of the invention is preferably in the range of 40 to 90° C. Lower temperatures may lower the deposition rate. Over the range, there is concern that the bath becomes instabilized.

When the electroless gold plating bath of the invention is brought into contact with a palladium plating film, the surface of the palladium plating film can be subjected to electroless gold plating treatment. In this case, a 0.01 to 2 μm thick of gold plating film can be formed in a contact time, for example, of 5 to 60 minutes. The gold plating film can be formed at a deposition rate, for example, of 0.002 to 0.03 μm/minute.

In the electroless gold plating method of the invention, it is possible that the whole of the electroless gold plating film is formed in a thickness of not smaller than 0.15 μm only by the first electroless gold plating. Alternatively, it is also possible that part of the electroless gold plating film is formed by electroless gold plating using the first electroless gold plating bath as set out hereinbefore and a residue of the electroless gold plating film is formed by a second electroless gold plating using a reduction gold plating bath different from the first electroless gold plating bath. In this case, the reduction gold plating bath used is a hitherto known reduction gold plating bath and the gold plating may be carried out under known conditions.

The electroless gold plating method of the invention is suited not only for the case where an electroless gold plating film is formed in a thickness of not smaller than 0.15 μm, but also for the case where the thickness is smaller than 0.15 μm (but not smaller than 0.01 μm), especially, from 0.01 to 0.10 μm, which is adapted for the case where the surface of the electroless gold plating film is used as a solder bonding face.

The electroless gold plating method of the invention is favorable for gold plating treatment, for example, of wiring circuit mounting portions or terminal portions of printed circuit boards, ceramic substrates, semiconductor substrates, IC packages and the like.

EXAMPLES

Hereinafter, the invention is particularly described by way of Examples and Comparative Examples. The invention should not be construed as limited to these examples.

Examples 1 to 5, Comparative Examples 1 to 4

Using electroless nickel plating baths, electroless palladium plating baths and electroless gold plating baths, plated film laminates were formed by subjecting substrates to the respective plating treatments under conditions indicated in Table 2. The laminates were evaluated according to the following methods with respect the wire bonding characteristic and solder bondability. The thicknesses and the results of the evaluation of the wire bonding characteristic and solder bondability of the respective films are shown in Table 1.

Solder Bondability

Twenty-point evaluation per condition was made using Bond Tester Series 4000, made by Dage Inc. A solder breakage rate of a breakage mode is shown in Table 1. The measuring conditions are indicated below. In general, the solder breakage rate is evaluated as "good" at 85% or over and as "poor" at smaller than 85%.

[Measuring Conditions]

| Measuring system: | ball pull test |
|---|---|
| Substrate: | BGA substrate (PAT diameter ϕ of 0.5 mm, made by C. Uyemura & Co., Ltd.) |
| Solder ball: | ϕ 0.6 mm, Sn—3.0Ag—0.5Cu, made by Senju Metal Industry Co., Ltd. |
| Reflow device: | TMR-15-22LH, made by Tamura Corporation |
| Reflow condition: | Top 260° C. |
| Reflow environment: | air |
| Reflow cycles: | one and five cycles |
| Flux: | 529D-1 (RMA type), made by Senju Metal Industry Co., Ltd. |
| Test speed: | 5000 μm/second |
| Aging after solder mount: | 1 hour |

Wire Bondability

Wire bonding was carried out by use of semi-automatic wire bonder HB16, made by TPT Co., Ltd., followed by 20-point evaluation per condition by means of Bond Tester Series 4000, made by Dage Inc. The W/B (wire bonding) average strength and a coefficient of variation are shown in Table 1. It will be noted that the measuring conditions are those indicated below. In general, the W/B average strength is evaluated as "good" at 8 g or over and as "bad" at smaller than 8 g, and the CV is evaluated as "good" at 15% or below and as "bad" at larger than 15%.

[Measuring Conditions]

| Capillary: | B1014-51-18-12 (PECO) |
|---|---|
| Wire: | 1 Mil-Gold |
| Stage temperature: | 150° C. |
| Supersonic wave (mW): | 250 (1st), 250 (2nd) |
| Bonding time (milliseconds): | 200 (1st), 50 (2nd) |
| Tensile force (gf): | 25 (1st), 50 (2nd) |
| Step (length from the first to second): | 0.700 mm |
| Measuring method: | wire pull test |
| Substrate: | BGA substrate, made by C. Uyemura & Co., Ltd. |
| Test speed: | 170 μm/second |

TABLE 1

| | | Example | | | | | Comparative Example | | | |
|---|---|---|---|---|---|---|---|---|---|---|
| | | 1 | 2 | 3 | 4 | 5 | 1 | 2 | 3 | 4 |
| Electroless Ni Plating | Nickel sulfate (g/L) | 20 | 20 | 20 | 20 | 20 | 20 | 20 | 20 | 20 |
| | Sodium hypophosphite (g/L) | 20 | 20 | 20 | 20 | 20 | 20 | 20 | 20 | 20 |
| | Malic acid (g/L) | 10 | 10 | 10 | 10 | 10 | 10 | 10 | 10 | 10 |
| | Sodium succinate (g/L) | 20 | 20 | 20 | 20 | 20 | 20 | 20 | 20 | 20 |
| | Lead ion (mg/L) | 1.0 | 1.0 | 1.0 | 1.0 | 1.0 | 1.0 | 1.0 | 1.0 | 1.0 |
| | Sodium thiosulfate (mg/L) | 1.0 | | | | 1.0 | 1.0 | | | |
| | Sodium dithionate (mg/L) | | 5.0 | | | | | 5.0 | | |
| | Sodium polythionate (mg/L) | | | 7.0 | | | | | 7.0 | |
| | Sodium dithionite (mg/L) | | | | 9.0 | | | | | 9.0 |
| | pH | 4.6 | 4.6 | 4.6 | 4.6 | 4.6 | 4.6 | 4.6 | 4.6 | 4.6 |
| Electroless Pd Plating | Palladium chloride (g/L) | 5.5 | 5.5 | 5.5 | | 5.5 | 5.5 | 5.5 | | |
| | Tetramine palladium chloride (g/L) | | | | 1.3 | | | | | 1.3 |
| | Ethylenediamine (g/L) | 25 | 25 | 25 | 25 | 25 | 25 | 25 | 25 | |
| | EDTA (g/L) | 10 | | | 10 | 10 | | | 10 | |
| | Glycine (g/L) | | 2.5 | 2.5 | | | | 2.5 | 2.5 | |
| | Sodium hypophosphite (g/L) | 20 | 20 | 20 | 20 | 20 | 20 | 20 | 20 | |
| | Acrylic acid (g/L) | 25 | | | | 25 | | | | |
| | Maleic acid (g/L) | | 25 | | | | 25 | | | |
| | Fumaric acid (g/L) | | | 25 | | | | | 25 | |

TABLE 1-continued

|  |  | Example |  |  |  |  | Comparative Example |  |  |  |
|---|---|---|---|---|---|---|---|---|---|---|
|  |  | 1 | 2 | 3 | 4 | 5 | 1 | 2 | 3 | 4 |
|  | Citraconic acid (g/L) |  |  |  | 25 |  |  |  | 25 |  |
|  | pH | 8.0 | 8.0 | 8.0 | 8.0 | 8.0 | 8.0 | 8.0 | 8.0 |  |
| Electroless | Gold potassium cyanide (g/L) | 2 | 2 | 2 | 2 |  |  |  |  | 2 |
| Au Plating | Potassium phosphate (g/L) |  |  |  | 10 |  |  |  |  | 10 |
| (1) | Ethylenediaminetetraacetic acid (g/L) | 15 | 15 | 15 | 10 |  |  |  |  | 10 |
|  | formaldehyde sodium bisulfite (g/L) |  |  |  | 2 |  |  |  |  | 2 |
|  | Formaldehyde (g/L) | 1 | 1 | 1 |  |  |  |  |  |  |
|  | Amine compound 1 (g/L) | 20 | 20 | 20 |  |  |  |  |  |  |
|  | Amine compound 2 (g/L) |  |  |  | 10 |  |  |  |  | 10 |
|  | pH | 7.0 | 7.0 | 7.0 | 7.1 |  |  |  |  | 7.1 |
|  | Plating time (minutes) | 10 | 25 | 40 | 12 | 12 |  |  |  | 12 |
| Plating time (minutes) of electroless Au plating (2) (TAM-55) |  |  |  |  |  |  | 10 | 10 |  |  |
| Plating time (minutes) of electroless Au plating (3) (TMX-22) |  |  |  |  |  | 25 |  | 25 | 30 | 25 |
| Film | Electroless Ni (μm) | 6 | 6 | 6 | 6 | 6 | 6 | 6 | 6 | 6 |
| Thickness | Electroless Pd (μm) | 0.05 | 0.05 | 0.05 | 0.05 | 0.05 | 0.05 | 0.05 | 0.05 | — |
|  | Electroless Au (1) (μm) | 0.05 | 0.25 | 0.4 | 0.05 | 0.05 |  |  |  | 0.05 |
|  | Electroless Au (2) (μm) |  |  |  |  |  | 0.04 | 0.04 |  |  |
|  | Electroless Au (3) (μm) |  |  |  |  | 0.35 |  | 0.35 | 0.4 | 0.35 |
| Evaluation | W/B average strength | 11.6 | 13.2 | 13.8 | 9.4 | 14.1 | 9.1 | 13.5 | 11.2 | 13.4 |
|  | Coefficient of Variation: CV value | 13.3 | 4.2 | 5.4 | 13.9 | 4.5 | 18.2 | 7.9 | 11.3 | 5.5 |
|  | Solder bondability | 100 | 90 | 50 | 100 | 50 | 100 | 40 | 30 | 50 |

TAM-55: electroless immersion flash gold plating bath, made by C. Uyemura & Co., Ltd.
TMX-22: electroless reduction gold plating bath, made by C. Uyemura & Co., Ltd.
Amine compound-1: in the formula (1), $R_1 = C_2H_5$ and $R_2 = C_2H_4OH$
Amine compound-2: in the formula (1), $R_1 = C_2H_4OH$ and $R_2 = C_2H_4OH$

TABLE 2

|  |  | Temperature (°C.) | Time (minutes) |
|---|---|---|---|
| Cleaner | ACL-009, made by C. Uyemura & Co., Ltd. | 50 | 5 |
| Soft etching | Sodium persulfate 100 g/L Sulfuric acid 20 g/L | 25 | 1 |
| Acid rinse | Sulfuric acid 50 g/L | 25 | 1 |
| Activator | MNK-4, made by C. Uyemura & Co., Ltd. | 30 | 2 |
| Electroless nickel plating | Bath indicated in Table 1 | 80 | 30 |
| Electroless palladium plating | Bath indicated in Table 1 | 50 | 5 |
| Electroless gold plating | Bath indicated in Table 1 | 80 | Time indicated in Table 1 |

The invention claimed is:

1. A method for forming an electroless gold plating film of a plated film laminate comprising:

forming, on a surface to be plated of an electronic part being a printed circuit board, a ceramic substrate or a semiconductor substrate, a 0.1 to 20 μm thick of electroless nickel plating film through a catalyst;

forming a 0.001 to 0.3 μm thick of electroless palladium plating film on said electroless nickel plating film; and forming a 0.01 to 1.0 μm thick of electroless gold plating film on said electroless palladium plating film, wherein part or whole of said electroless gold plating film is formed by a first electroless gold plating using an electroless gold plating bath comprising a water-soluble gold compound, a complexing agent, formaldehyde and/or a formaldehyde-bisulfite adduct, and an amine compound represented by the following general formula (1) or (2)

$$R_1\text{—NH—}C_2H_4\text{—NH—}R_2 \quad (1)$$

$$R_3\text{—}(CH_2\text{—NH—}C_2H_4\text{—NH—}CH_2)_n\text{—}R_4 \quad (2)$$

wherein $R_1$ and $R_3$ represent —OH, —$CH_2OH$, —$C_2H_4OH$, —$CH_2N(CH_3)_2$, —$CH_2NH(CH_2OH)$, —$CH_2NH(C_2H_4OH)$, —$C_2H_4NH(CH_2OH)$, —$C_2H_4NH(C_2H_4OH)$, —$CH_2N(CH_2OH)_2$, —$CH_2N(C_2H_4OH)_2$, —$C_2H_4N(CH_2OH)_2$ or —$C_2H_4N(C_2H_4OH)_2$ and may be the same or different, $R_2$, and $R_4$ represent —OH, —$CH_3$, —$CH_2OH$, —$C_2H_4OH$, —$CH_2N(CH_3)_2$, —$CH_2NH(CH_2OH)$, —$CH_2NH(C_2H_4OH)$, —$C_2H_4NH(CH_2OH)$, —$C_2H_4NH(C_2H_4OH)$, —$CH_2N(CH_2OH)_2$, —$CH_2N(C_2H_4OH)_2$, —$C_2H_4N(CH_2OH)_2$ or —$C_2H_4N(C_2H_4OH)_2$ and may be the same or different, and n is an integer of 1 to 4.

2. The electroless gold plating method according to claim 1, wherein a surface of said electroless gold plating film is provided as a face to be soldered.

3. The electroless gold plating method according to claim 1, wherein the whole of said electroless gold plating film is formed in a thickness of not smaller than 0.15 μm only by said first electroless gold plating.

4. The electroless gold plating method according to claim 3, wherein the surface of said electroless gold plating film is provided as a face to be soldered or a face to be wire bonded.

5. The electroless gold plating method according to claim 1, wherein part of said electroless gold plating film is formed by an electroless gold plating using the first electroless gold plating bath, and the remainder of said electroless gold plating film is formed by a second electroless gold plating using a reduction gold plating bath different from said first electroless gold plating bath.

6. The electroless gold plating method according to claim 5, wherein the surface of said electroless gold plating film is provided as a face to be soldered or a face to be wire bonded.

* * * * *